United States Patent
Nishi

(10) Patent No.: US 6,937,319 B2
(45) Date of Patent: Aug. 30, 2005

(54) EXPOSURE METHOD AND APPARATUS WITH VIBRATION-PREVENTATIVE CONTROL

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/756,343

(22) Filed: Jan. 14, 2004

(65) Prior Publication Data

US 2004/0160586 A1 Aug. 19, 2004

Related U.S. Application Data

(63) Continuation of application No. 10/365,534, filed on Feb. 13, 2003, now abandoned, which is a continuation of application No. 09/721,734, filed on Nov. 27, 2000, now abandoned.

(30) Foreign Application Priority Data

Dec. 16, 1999 (JP) .......................................... 11-358203

(51) Int. Cl.⁷ ........................ G03B 27/42; G03B 27/58; G03B 27/62
(52) U.S. Cl. ............................. 355/53; 355/72; 355/75
(58) Field of Search ............................. 355/53, 75, 72; 348/550; 318/560, 687, 568.17, 568.15; 378/34

(56) References Cited

U.S. PATENT DOCUMENTS

| | | |
|---|---|---|
| 5,528,118 A | 6/1996 | Lee |
| 5,767,948 A | 6/1998 | Loopstra et al. |
| 5,812,420 A | 9/1998 | Takahashi |
| 6,020,710 A | 2/2000 | Lee |
| 6,084,673 A | 7/2000 | Van Den Brink et al. |
| 6,262,796 B1 | 7/2001 | Loopstra et al. |
| 6,359,679 B1 * | 3/2002 | Ito et al. ........................ 355/75 |
| 6,396,566 B2 | 5/2002 | Ebinuma et al. |
| 6,408,045 B1 * | 6/2002 | Matsui et al. .................. 378/34 |
| 6,417,914 B1 | 7/2002 | Li |

FOREIGN PATENT DOCUMENTS

| | | |
|---|---|---|
| GB | 2 290 658 | 1/1996 |
| JP | 3-221336 | 9/1991 |
| JP | 5-47633 | 2/1993 |
| JP | 8-63231 | 3/1996 |
| JP | 8-166475 | 6/1996 |
| JP | 8-330224 | 12/1996 |
| JP | 10-74685 | 3/1998 |
| JP | 11-307425 | 11/1999 |
| WO | WO 00/39623 | 7/2000 |

\* cited by examiner

Primary Examiner—Peter B. Kim
(74) Attorney, Agent, or Firm—Oliff & Berridge, PLC

(57) ABSTRACT

A high exposure accuracy is obtained while mitigating the influence of vibration by using an exposure method and an exposure apparatus. Columns (59A, 59B) are installed on a base plate (12), a reticle base (62) is supported at the inside of the columns (59A, 59B) by the aid of variable mount sections (61A, 61B) having high rigidity, a finely movable stage (63) is movably placed on the reticle base (62) by the aid of air bearings, and a reticle (R1) as an exposure objective is placed on the finely movable stage (63). A coarsely movable stage (64) is hung on a bottom surface of a support plate (66) arranged over the reticle base (62) in a state capable of being driven in a scanning direction. The finely movable stage (63) is driven by the coarsely movable stage (64) in the scanning direction in a non-contact state with respect to the reticle base (62). The finely movable stage (63) is finely driven with respect to the coarsely movable stage (64) by an actuator arranged between the coarsely movable stage (64) and the finely movable stage (63).

19 Claims, 7 Drawing Sheets

EXPOSURE METHOD AND APPARATUS WITH VIBRATION-PREVENTATIVE CONTROL

This is a Continuation of application Ser. No. 10/365,534 filed Feb. 13, 2003 abandoned, which in turn is a Continuation of application Ser. No. 09/721,734 filed Nov. 27, 2000 abandoned. The entire disclosure of the prior applications is hereby incorporated by reference herein in its entirety.

BACKGROUND OF THE INVENTION

1. Field of the Invention

The present invention relates to an exposure method and an exposure apparatus to be used, for example, when a mask pattern is transferred onto a substrate in the lithography step for producing, for example, semiconductor elements, liquid crystal display elements, plasma display elements, and thin film magnetic heads. In particular, the present invention relates to an exposure apparatus in which a vibration-preventive control is adopted.

2. Description of the Related Art

A high exposure accuracy is required for the exposure apparatus of the full field exposure type (stepper type) or the scanning exposure type (for example, those based on the step-and-scan system) to be used when the semiconductor element or the like is produced. Therefore, in the exposure apparatus, an arrangement, which makes it possible to perform highly accurate positioning or highly accurate scanning, is adopted for a reticle stage on which a reticle as a mask is placed and positioned and for a wafer stage in which a wafer as a substrate is placed and two-dimensionally moved respectively.

That is, the reticle stage for the conventional exposure apparatus of the scanning exposure type is arranged, for example, such that a frame-shaped coarsely movable stage, which is movable at an approximately constant velocity in the scanning direction, is placed on a reticle base, and a finely movable stage, on which the reticle is placed, is connected into the coarsely movable stage by the aid of an actuator which is used to perform positioning in a minute amount two-dimensionally. In this arrangement, the coarsely movable stage and the finely movable stage are slidably placed on the common reticle base by the aid of air bearings respectively.

Also in the case of the reticle stage for the conventional exposure apparatus of the full field exposure type, a driving unit such as a linear motor, which is used to drive a movable stage on which the reticle is placed, is installed on the reticle stage On the other hand, in recent years, in order to enhance the throughput, a so-called double-wafer stage, which is provided with two movable stages, has been suggested as a wafer stage for the exposure apparatus. When the double-wafer stage is used, the throughput can be improved by performing exchange and alignment for a wafer on the second movable stage during a period in which exposure is performed for a wafer on the first movable stage. The conventional double-wafer stage has been constructed as follows in order to simplify the arrangement. That is, a guide for one axis of two orthogonal driving axes is commonly used by the two movable stages, or the two movable stages are independently driven by using plane motors.

Further, a system, which is based on the mechanical contact such that upward and downward movement is performed, for example, with a cam mechanism, is adopted for the driving system for a sample base (Z leveling stage) for performing leveling and focusing in the conventional wafer stage.

The conventional exposure apparatus has been assembled on a base plate which is installed by the aid of a plurality of (for example, four) vibration-preventive pedestals including air dampers in order to mitigate the influence of vibration from the floor. However, when an excimer laser light source is used as an exposure light source, some of members of the exposure light source and the illumination optical system are supported by support members different from the base plate. Recently, in order to allow other stage sections and other components to be not affected by the vibration generated in respective stage sections of the exposure apparatus, a system has been also suggested, in which a wafer base for supporting a wafer stage and a reticle base for supporting a reticle stage are supported mutually independently by a plurality of active type vibration-preventive units including air dampers and control units respectively.

Among the conventional exposure apparatuses as described above, as for the system in which the base plate is supported by the aid of the plurality of vibration-preventive pedestals on the floor, and the approximately entire mechanism of the exposure apparatus is placed thereon, the influence of the vibration between the respective stage sections is directly transmitted to the other stage sections especially in the case of the scanning exposure system. Therefore, it is feared that the exposure accuracy (for example, the transfer faithfulness such as the line width accuracy and the overlay accuracy) may be deteriorated. In the case of the system in which the reticle base and the wafer base are supported mutually independently by using the plurality of active type vibration-preventive units including the air dampers and the electromagnetic control units respectively, for example, the vibration having a low frequency from the floor tends to be independently transmitted to the both stage sections via the air dampers. Therefore, it is feared, for example, that any positional discrepancy concerning the low frequency may occur between the both stage sections.

In the case of the conventional reticle stage, the coarsely movable stage or the driving mechanism or the like for driving the movable stage (for example, the finely movable stage) is installed together on the reticle base. Therefore, the vibration, which is generated in the coarsely movable stage or the driving mechanism or the like, tends to be transmitted to the movable stage (reticle). For example, when the driving velocity of the movable stage is increased in order to enhance the throughput, it is feared that the positioning accuracy for the reticle or the accuracy of the scanning velocity or the like may be lowered. On the other hand, an inconvenience arises such that the throughput cannot be enhanced so much in order to maintain, for example, the positioning accuracy for the reticle to be within a predetermined range. Further, it is necessary to increase the rigidity of the reticle base in order to maintain a satisfactory flatness of the sliding surface for the movable stage, because the movable stage or the driving mechanism or the like is installed together on the reticle base. As a result, an inconvenience arises such that the exposure apparatus becomes large in size, and the weight is increased as well.

Taking the foregoing points into consideration, a first object of the present invention is to provide an exposure method and an exposure apparatus in which the influence of vibration is mitigated, and a high exposure accuracy is obtained.

A second object of the present invention is to provide an exposure method and an exposure apparatus provided with a reticle stage capable of controlling a movable stage at a high velocity and with a high accuracy without increasing the load on a reticle base, in which the influence of vibration on the side of a driving mechanism is mitigated.

Another object of the present invention is to provide a production method which makes it possible to efficiently produce the exposure apparatus as described above, and a method for producing devices, which makes it possible to produce a highly accurate device by using the exposure method as mentioned above.

SUMMARY OF THE INVENTION

A first exposure method according to the present invention lies in an exposure method for exposing a second object (W1) with an exposure light beam passing through a pattern of a first object (R1); the exposure method comprising preparing a base member (62); and a movable stage (63) which is arranged movably on the base member and on which the first object is placed; wherein the movable stage is driven in a predetermined direction without being in contact with the base member.

According to the exposure method as described above, the vibration, which is caused when the movable stage is driven, is not transmitted to the movable stage and consequently to the first object. Thus, it is possible to obtain a high exposure accuracy.

In this process, it is desirable that a guide member (71A, 71B) is arranged over the base member; and the movable stage is driven in the predetermined direction along the guide member in a state in which law of conservation of momentum is substantially satisfied. It is possible to suppress the occurrence of vibration by satisfying the law of conservation of momentum as described above.

In another aspect, a first exposure apparatus according to the present invention lies in an exposure apparatus for exposing a second object (W1) with an exposure light beam passing through a pattern of a first object (R1); the exposure apparatus comprising a base member (62); a movable stage (63) which is arranged movably on the base member and on which the first object is placed; and a coarsely movable stage (64) which drives the movable stage in a predetermined direction without being in contact with the base member.

According to the exposure apparatus as described above, the movable stage is placed movably on the base member, for example, in accordance with the air bearing system. The movable stage is driven by the coarsely movable stage at a high velocity with a high accuracy, and the coarsely movable stage is out of contact with the base member. Therefore, the vibration, which is caused on the side of the driving mechanism for driving the coarsely movable stage, is not transmitted to the movable stage and consequently to the first object. Thus, it is possible to obtain a high exposure accuracy.

In this arrangement, for example, the driving mechanism for the coarsely movable stage (64) has a guide member (71A, 71B) which is arranged over the base member; and a driving unit (76YA, 76YB) which drives the coarsely movable stage in the predetermined direction along the guide member. That is, the coarsely movable stage is supported so that it hangs from an upward position. Owing to this arrangement, it is possible to easily drive the coarsely movable stage at a high velocity.

It is desirable that the first object and the second object are synchronously scanned in the predetermined direction (Y direction) when the second object is exposed; and the guide member (71A, 71B) is moved in an opposite direction so that law of conservation of momentum is substantially satisfied when the coarsely movable stage is driven in the predetermined direction by the aid of the driving unit. This means that the present invention is applied, for example, to the exposure apparatus based on the scanning exposure system such as the step-and-scan system. When the law of conservation of momentum is substantially satisfied as described above, the influence of vibration is scarcely transmitted to other portions, when the movable stage is driven in the scanning direction by the aid of the coarsely movable stage. Thus, the influence of vibration is greatly reduced.

It is, desirable that the exposure apparatus further comprises a first measuring unit (79) which measures a position of the coarsely movable stage in the predetermined direction; a second measuring unit (81X, 81YA, 81YB) which measures a two-dimensional position of the movable stage; and an actuator (78XA, 78XB, 78Y) which finely moves the movable stage two-dimensionally with respect to the coarsely movable stage. The relative positional relationship between the coarsely movable stage and the movable stage can be determined from the difference between a measured value obtained by the first measuring unit and a measured value obtained by the second measuring unit. The synchronization accuracy can be improved during the scanning exposure by driving the movable stage substantially in the vicinity of a neutral position in a movable range so that the synchronization error is corrected on the basis of the relative positional relationship. The movable stage also functions as a finely movable stage.

A plurality of masks (R1, R2) to serve as the first object may be placed in the predetermined direction on the movable stage. Accordingly, patterns of the plurality of masks can be transferred onto the second object with a high throughput.

In still another aspect, a second exposure apparatus according to the present invention lies in an exposure apparatus for exposing a second object (W1) with an exposure light beam passing through a first object (R1); the exposure apparatus comprising a first movable member (63) which holds one of the first object and the second object and which is arranged on a first base member (62); and a second movable member (64) which is arranged on a second base member (66) different from the first base member and which is used to drive the first movable member.

According to the exposure apparatus as described above, it is possible to carry out the first exposure method of the present invention. In this arrangement, it is desirable that the first movable member is coupled to the second movable member in a non-contact manner. Accordingly, the vibration, which is caused when the second movable member is driven, is not transmitted to the first movable member and consequently to the first object and the second object.

It is desirable that the first movable member has its degrees of freedom of a number which is larger than that of the second movable member. Accordingly, for example, the second movable member can be driven coarsely, and the first movable member can be finely moved so that any remaining error is reduced. Therefore, it is easy to make the control during the exposure.

It is desirable that the exposure apparatus further comprises a first actuator (78XA, 78XB, 78Y) which relatively moves the first movable member with respect to the second movable member; and a second actuator (76YA, 76YB) which relatively moves the second movable member with respect to the second base member.

In still another aspect, a first method for producing an exposure apparatus according to the present invention lies in a method for producing an exposure apparatus for exposing a second object with an exposure light beam passing through a pattern of a first object; the method comprising arranging a base member (62) on a bottom surface side of the first object; arranging a movable stage (63) so as to be movable and place the first object thereon, on the base member; arranging a guide member (71A, 71B) in a predetermined direction on the base member; arranging a coarsely movable stage (64) movably along the guide member and opposingly to at least a part of the movable stage; and coupling the movable stage and the coarsely movable stage to one another. According to the production method as described above, it is possible to efficiently assemble the first exposure apparatus of the present invention.

In still another aspect, a second exposure method according to the present invention lies in an exposure method for exposing a second object (W1) with an exposure light beam passing through a pattern of a first object (RI); the exposure method comprising supporting a second base member (62) in a state capable of making displacement with a predetermined number of degrees of freedom on a first base member (12); placing a first movable stage (63) for positioning the first object movably on the second base member; placing a second movable stage (14A) for positioning the second object movably on the first base member; and controlling an attitude of the second base member with respect to the first base member so as to suppress vibration caused by movement of the first and second movable stages.

According to the exposure method as described above, the vibration having a low frequency is scarcely transmitted to the first and second movable stages independently. Further, it is possible to suppress the vibration having a relatively high frequency of the first movable stage by controlling the attitude of the second base member. Thus, the influence of the vibration is mitigated.

In this process, it is desirable that the exposure method further comprises supporting a third base member (53) in a state capable of making displacement with a predetermined number of degrees of freedom on the first base member; placing, on the third base member, a projection system (PL) for projecting an image of the pattern of the first object onto the second object; and further controlling an attitude of the third base member with respect to the first base member so as to suppress the vibration caused by the movement of the first and second movable stages. Accordingly, the projection system is stably held as well.

In still another aspect, a third exposure apparatus according to the present invention lies in an exposure apparatus for exposing a second object (W1) with an exposure light beam passing through a pattern of a first object (R1); the exposure apparatus comprising a first base member (12) which is supported by the aid of a plurality of vibration-preventive pedestals (11A, 11B); a second base member (62) which is placed on the first base member by the aid of a plurality of expandable/contractible or displaceable first attitude control members (61A to 61C); a first movable stage (63) which is arranged movably on the second base member and which positions the first object; and a second movable stage (14A) which is arranged movably on the first base member and which positions the second object.

According to the exposure method as described above, for example, an active type vibration-preventive unit, which includes a mechanical damper such as an air damper and an electromagnetic damper, can be used for each of the plurality of vibration-preventive pedestals (11A, 11B). For example, a driving element (hard mount) such as a piezoelectric element and a magnetostrictive element, which has a high rigidity and which has a high response speed, can be used for each of the first attitude control members (61A to 61C). In this arrangement, the vibration having a low frequency is scarcely-transmitted to the first and second movable stages mutually independently. The vibration of the first movable stage having a relatively high frequency can be suppressed by the aid of the first attitude control members. Therefore, the influence of the vibration is mitigated.

In this arrangement, for example, the exposure apparatus further comprises a projection system (PL) which projects an image of the pattern of the first object onto the second object; and a third base member (53) which is placed on the first base member by the aid of a plurality of expandable/contractible or displaceable second attitude control members (52A to 52C); wherein the projection system is supported on the third base member. According to this arrangement, the vibration having a low frequency is not transmitted to the projection system as well. Further, the vibration having a high frequency is suppressed by the second attitude control members. Therefore, the position can be also measured highly accurately, for example, by installing, on the third base member, a main body section of a laser interferometer as a position-measuring unit.

It is desirable that a cutout (53a) is provided for the third base member; and the projection system is installed accessibly in a side surface direction with respect to the cutout.

It is desirable that the projection system is supported on the third base member by the aid of a plurality of expandable/contractible or displaceable third attitude control members (56).

In still another aspect, a second method for producing an exposure apparatus according to the present invention lies in a method for producing an exposure apparatus for exposing a second object with an exposure light beam passing through a pattern of a first object; the method comprising supporting a first base member (12) by the aid of a plurality of vibration-preventive pedestals (11A, 11B); placing a second base member (62) on the first base member by the aid of a plurality of expandable/contractible or displaceable first attitude control members (60A to 60C); movably placing, on the second base member, a first movable stage (63) for positioning the first object; and movably placing, on the first base member, a second movable stage (14A) for positioning the second object. According to the production method as described above, it is possible to efficiently produce the third exposure apparatus of the present invention.

In still another aspect, a method for producing a device according to the present invention comprises the step of performing exposure by using the exposure method or the exposure apparatus of the present invention. A high exposure accuracy is obtained according to the present invention, and hence it is possible to produce the device having the high function which is excellent, for example, in pattern faithfulness.

DESCRIPTION OF THE PREFERRED EMBODIMENTS OF THE INVENTION

An exemplary preferred embodiment of the present invention will be explained below with reference to the drawings. In this embodiment, the present invention is applied to a projection exposure apparatus based on the scanning exposure system of the step-and-scan system.

Figure 1:
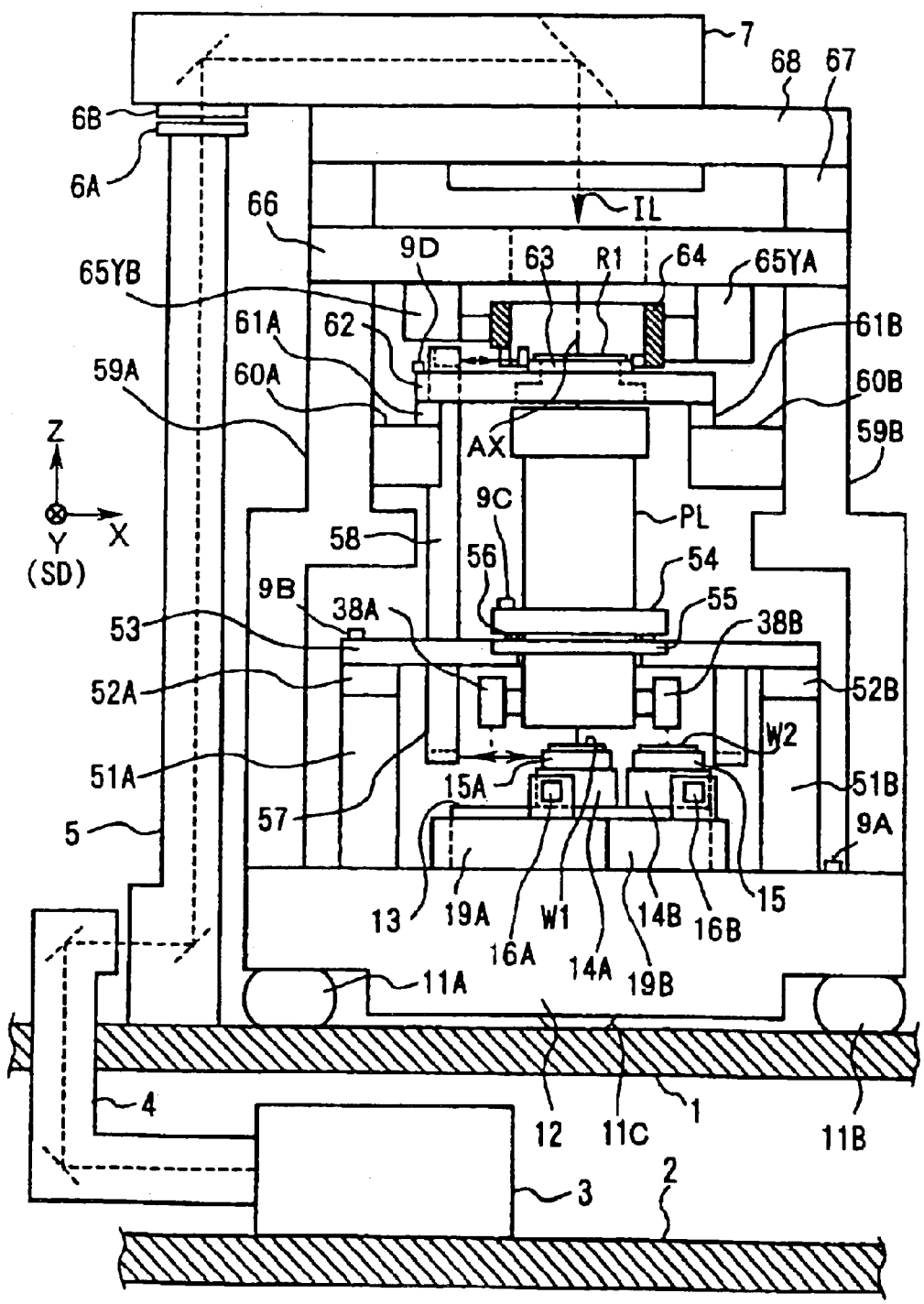
FIG. 1 shows, with partial cutaway, a schematic arrangement illustrating a projection exposure apparatus of an exemplary embodiment according to the present invention.

FIG. 1 shows the projection exposure apparatus according to this embodiment. With reference to FIG. 1, for example, most parts of the projection exposure apparatus of this embodiment are installed on a floor 1 in a clean room in a semiconductor-manufacturing factory. An exposure light source 3 of the projection exposure apparatus is installed on a floor 2 in a semi-clean room in a machine room disposed thereunder. Those usable as the exposure light source 3 include, for example, an excimer laser light source such as KrF (wavelength: 248 nm) and ArF (wavelength: 193 nm), an $F_2$ laser light source (wavelength: 157 nm), a $Kr_2$ laser light source (wavelength: 146 nm), a high harmonic wave generator of a YAG laser, a high harmonic wave generator of a semiconductor laser, and a mercury lamp.

An exposure light beam IL as an exposure beam, which is radiated from the exposure light source 3 during the exposure, passes along a beam matching unit (BMU) 4, and it is introduced beyond the floor 1. The exposure light beam IL, which outgoes from the BMU 4, comes into a first illumination system 5 which is installed on the floor 1 and which includes, for example, a beam-shaping optical system, an optical integrator (uniformizer or homogenizer) for uniformizing the illuminance distribution, a light amount monitor, a variable aperture diaphragm, and a relay lens system. The light-outgoing plane of the first illumination system 5 is substantially conjugate with a pattern plane of a reticle as an illumination object. A movable field diaphragm 6A is arranged on the light-outgoing plane. The movable field diaphragm 6A plays the following role. That is, upon the start and the end of the scanning exposure for respective shot areas on a wafer as a substrate to be exposed, the field is opened/closed so that any pattern other than the original circuit pattern is not subjected to exposure. Further, the movable field diaphragm 6A selects only a circuit pattern which is required for exposure for a concerning layer in a pattern area of the reticle. The first illumination system 5, which is arranged with the movable field diaphragm 6A which involves such a fear that the vibration may be generated when the field is opened/closed, is supported separately from a main exposure apparatus body. Therefore, the exposure accuracy (for example, overlay accuracy and transfer faithfulness) is improved for the main exposure apparatus body.

Alternatively, the following arrangement may be available. That is, the first illumination system 5 is supported on the floor 1 by the aid of a vibration-preventive mechanism of the active type or the passive type.

The exposure light beam IL, which has passed through the movable field diaphragm 6A, comes into a fixed field diaphragm 6B which is arranged at a light-incoming plane of a second illumination system 7 attached to a column section of the main exposure apparatus body, i.e., a plane defocused by a predetermined amount from the pattern plane of the reticle. The fixed field diaphragm 6B is formed with an aperture for defining the illumination area on the pattern plane of the reticle to be a slit-shaped area which is slender in the non-scanning direction perpendicular to the scanning direction. The exposure light beam IL, which has passed through the fixed field diaphragm 6B, passes along, for example, a relay lens system, an optical path-bending mirror, and a condenser lens system in the second illumination system 7, and it illuminates the illumination area of the pattern plane of the reticle R1 as a mask.

The position of the fixed field diaphragm 6B is not limited to the light-incoming plane of the second illumination system 7. The fixed field diaphragm 6B may be arranged, for example, at the light-outgoing plane of the second illumination system 7, i.e., the plane separated by a predetermined amount from the pattern plane of the reticle, or at a plane disposed between the reticle and the projection optical system PL and separated by a predetermined amount from the pattern plane.

Under the exposure light beam IL, the image of the pattern in the illumination area on the reticle R1 is projected onto a slit-shaped exposure area on the wafer W1 (or W2) applied with photoresist as a photosensitive substrate (substrate to be exposed) at a projection magnification β (β is, for example, ¼-fold or ⅕-fold) by the aid of the projection optical system PL. In this state, the reticle R1 and the wafer W1 are synchronously moved in the predetermined scanning direction by using the projection magnification β as a velocity ratio.

Accordingly, the image of the pattern on the reticle R1 is transferred to one shot area on the wafer W1. The reticle R1 and the wafer W1, W2 correspond to the first object and the second object of the present invention respectively. The wafer W1, W2 is, for example, a disk-shaped substrate of semiconductor (for example, silicon) or SOI (silicon on insulator).

As disclosed, for example, in International Publication (WO) 00/39623, those usable as the projection optical system PL include, for example, a cata-dioptric system of the normal cylinder type constructed by arranging a plurality of dioptric lenses along one optical axis and two concave mirrors having openings in the vicinity of the optical axis respectively, and a dioptric system of the normal cylinder type constructed by arranging dioptric lenses along one optical axis. WO 00/39623 is incorporated herein by reference. A cata-dioptric system having a form in which an optical axis is bent in a V-shaped configuration, or a cata-dioptric system of the double-cylinder type may be used for the projection optical system PL. The following explanation will be made assuming that the Z axis extends in parallel to the optical axis AX of the projection optical system PL, the X axis extends in the non-scanning direction (i.e., the direction parallel to the plane of paper of FIG. 1) perpendicular to the scanning direction for the reticle R1 and the wafer W1 during the scanning exposure in the plane (substantially coincident with the horizontal plane in this embodiment) perpendicular to the Z axis, and the Y axis extends in the scanning direction (i.e., the direction perpendicular to the plane of paper of FIG. 1).

At first, explanation will be made for the overall arrangement of the main exposure apparatus body of this embodiment including a stage system for supporting the reticle R1, the projection optical system PL, and a stage system for supporting the wafers W1, W2. That is, a base plate 12 having high rigidity, which serves as a first base member, is installed by the aid of three vibration-preventive pedestals 11A, 11B, 11C approximately located at apexes of a regular triangle on the floor 1. An electric level 9A is installed on the base plate 12. Each of the vibration-preventive pedestals 11A to 11C is an active type vibration-preventive unit including a mechanical damper such as an air damper or a hydraulic pressure-based damper which is endurable to a heavy weight, and an electromagnetic damper which is composed of an electromagnetic actuator such as a voice coil motor. For example, the electromagnetic dampers in the three vibration-preventive pedestals 11A to 11C are driven, and the pneumatic pressure or the hydraulic pressure of each of the mechanical dampers is controlled, if necessary, so that the angles of inclination of the upper surface of the base plate 12 with respect to the horizontal plane detected by the level 9A (angles of inclination about the two axes, i.e., about the X axis and the Y axis) are included within allowable ranges. In this arrangement, the vibration having a high frequency from the floor is attenuated by the mechanical damper before being transmitted to the main exposure apparatus body. The remaining vibration having a low frequency is attenuated by the electromagnetic damper.

Three first columns 59A, 59B, 59C (59C appears in FIG. 2(a)) are fixed on the upper surface of the base plate 12 so that they are approximately located at apexes of a regular triangle. A support plate 66, which is provided at its central portion with an opening for allowing the exposure light beam IL to pass therethrough, is fixed on the upper surfaces of the first columns 59A to 59C. A support plate 68 is fixed on the support plate 66 with spacers 67 intervening therebetween. The second illumination system 7 is attached to the support plate 68. Variable mount sections 61A, 61B, 61C (61C appears in FIG. 4), each of which functions as an attitude control member, are fixed on three projections 60A, 60B (third projection is not shown) fixed to the inner surfaces of the first columns 59A to 59C. Those usable as each of the variable mount sections 61A to 61C include a piezoelectric device such as a piezoelectric element, and a driving element such as a magnetostrictive element which has a large rigidity and which is expandable/contractible in the Z direction at a high response speed (for example, the amplitude is about several μm, and the frequency is about 10 Hz to 1 kHz). Besides, those also usable as each of the variable mount sections 61A to 61C include a driving mechanism which makes displacement in the Z direction by means of a small cam mechanism. In view of the fact that the rigidity is high, the variable mount section 61A to 61C can be also referred to as "hard mount".

A reticle base 62, which serves as a base member (second base member), is fixed on the variable mount sections 61A to 61C. An opening for allowing the exposure light beam IL to pass therethrough is formed at a central portion of the reticle base 62. The upper surface of the reticle base 62 is machined into a guide surface which has an extremely excellent flatness. A finely movable stage 63, which serves as a movable stage on the reticle side, is slidably placed on the guide surface smoothly and two-dimensionally by the aid of air bearings. The reticle R1 is held on the finely movable stage 63, for example, by means of vacuum attraction. Another reticle R2 (see FIG. 2(a)) is held in an area adjacent to the reticle R1 in the scanning direction on the finely movable stage 63. The exposure apparatus is constructed so that, for example, the double exposure can be efficiently executed.

An electric level 9D is installed at an end portion of the guide surface of the reticle base 62. For example, the expansion/contraction amounts (or displacement amounts) of the three variable mount sections 61A to 61C are controlled so that angles of inclination of the guide surface with respect to the horizontal plane detected by the level 9D (angles of inclination about the two axes, i.e., about the X axis and the Y axis) are included within allowable ranges. In this procedure, it is enough to control the angles of inclination about the two axes at the minimum. Therefore, for example, one of the three variable mount sections 61A to 61C may be a spacer with a fixed height. In place of the level 9D (as well as levels described later on), for example, a detector for optically detecting the slope of a corresponding member may be used.

A rectangular frame-shaped coarsely movable stage 64 is arranged so that the finely movable stage 63 of this embodiment is surrounded thereby. A pair of Y axis driving units 65YA, 65YB are attached to the bottom surface of the support plate 66 disposed thereover so that they extend in parallel in the Y direction. The coarsely movable stage 64 is connected to the Y axis driving units 65YA, 65YB. The coarsely movable stage 64 is out of contact with the reticle base 62. The coarsely movable stage 64 and the finely movable stage 63 are connected to one another by the aid of an actuator which drives the finely movable stage 63 with respect to the coarsely movable stage 64 in a minute amount in the X direction, the Y direction, and the direction of rotation within predetermined narrow ranges. The Y axis driving units 65YA, 65YB alternately drive the coarsely movable stage 64 in the +Y direction and the −Y direction at a constant velocity in accordance with the linear motor system. That is, the coarsely movable stage 64 drives the finely movable stage 63 in the Y direction at the constant velocity in a state of being held so that the coarsely movable stage 64 is hung from the support plate 66. Further, the finely movable stage 63 is relatively driven with respect to the coarsely movable stage 64 so that any remaining synchronization error is corrected. The two-dimensional position and the angle of rotation of the finely movable stage 63 and the position of the coarsely movable stage 64 in the Y direction are highly accurately measured by unillustrated laser interferometers respectively. The position and the velocity of the finely movable stage 63 are controlled on the basis of obtained results of the measurement.

In this embodiment, the reticle stage system is constructed, for example, by the reticle base 62, the finely movable stage 63, and the coarsely movable stage 64.

Further, three second columns 51A, 51B (third column is not shown) are fixed approximately at positions of apexes of a regular triangle at the inside of the first columns 59A, 59B, 59C (as for 59C, see FIG. 2(a)) on the upper surface of the base plate 12. Three variable mount sections 52A, 52B, 52C (as for 52C, see FIG. 5), which serve as attitude control members respectively, are fixed on the upper surfaces of the second columns 51A, 51B. Those usable as each of the variable mount sections 52A to 52C include, for example, a driving element based on the use of a piezoelectric element or the like and a driving mechanism based on the cam system in the same manner as the variable mount section 61A described above. A support plate 53, which serves as a base member (third base member), is fixed on the variable mount sections 52A to 52C. The projection optical system PL is installed to a U-shaped cutout provided for the support plate 53 by the aid of a flange 54. An open end of the cutout is closed by a cover 55. An electric level 9B is installed at an end portion of the upper surface of the support plate 53.

For example, the expansion/contraction amounts (or displacement amounts) of the three variable mount sections 52A to 52C are controlled so that angles of inclination of the upper surface with respect to the horizontal plane detected by the level 9B (angles of inclination about the two axes, i.e., about the X axis and the Y axis) are included within allowable ranges. Also in this procedure, it is enough to control the angles of inclination about the two axes at the minimum. Therefore, for example, one of the three variable mount sections 52A to 52C may be a spacer with a fixed height.

Driving elements 56, each of which is composed of, for example, a magnetostrictive element or a piezoelectric device such as a piezoelectric element to serve as an attitude control member, each of which has high rigidity, and each of which is expandable/contractible in the Z direction (direction of the optical axis AX), are installed at three places at intervals of approximately equal angles between the support plate 53 and the flange 54 for holding the projection optical system PL. An electric level 9C is installed to an end portion of the upper surface of the flange 54. For example, the expansion/contraction amounts of the three driving elements 56 are controlled so that angles of inclination of the upper surface with respect to the horizontal plane detected by the level 9C (angles of inclination about the two axes, i.e., about the X axis and the Y axis) are included within allowable ranges. Also in this procedure, it is enough to control the angles of inclination about the two axes at the minimum. Therefore, for example, one of the three driving elements 56 may be a spacer with a fixed height. As described above, the driving elements 56 for suppressing the vibration of the projection optical system PL itself are provided in addition to the variable mount sections 52A to 52C for suppressing the vibration of the support plate 53. Therefore, for example, the vibration of the cylindrical projection optical system PL is intensely suppressed, and the image formation characteristic is maintained in a well-suited manner.

Alignment sensors 38A, 38B, which are based on the image formation system of the off-axis system and the FIA (Field Image Alignment) system, are fixed to the side surfaces in the −X direction and the +X direction at the lower portion of the projection optical system PL in order to perform the alignment for the wafer. Although not shown, a reticle alignment microscope is arranged at the bottom surface portion of the support plate 66 disposed over the reticle R1 in order to perform the alignment for the reticle.

A wafer base 13 is fixed at a central portion in an area which is substantially surrounded by the three second columns 51A, 51B (third column is not shown) on the upper surface of the base plate 12. The upper surface of the wafer base 13 is machined into a guide surface which has an extremely excellent flatness. A first finely movable stage 14A on the side of the wafer is slidably placed on the guide surface smoothly by the aid of air bearings and two-dimensionally along sliders 16A, 19A. A first sample base 15A is placed on the movable stage 14A. The first wafer W1 is held on the sample base 15A by means of, for example, vacuum attraction. The movable stage 14A is continuously movable in the Y direction, for example, in accordance with the linear motor system, and it is movable in a stepping manner in the X direction and the Y direction. The sample base 15A is constructed such that it is finely movable in the X direction, the Y direction, and the direction of rotation with respect to the movable stage 14A, it is displaceable in the Z direction, and it is tiltable about the two axes (i.e., about the X axis and the Y axis) in order to perform the leveling and the focusing. In this embodiment, a second movable stage 14B is placed on the wafer base 13 by the aid of air bearings movably along sliders 16B, 19B together with the first movable stage 14A. The second wafer W2 is placed on the movable stage 14B by the aid of a second sample base 15B for the purpose of the leveling and the focusing. The second movable stage 14B is also driven two-dimensionally, for example, in accordance with the linear motor system so that the second movable stage 14B does not mechanically interfere with the movable stage 14A.

The wafer stage system of this embodiment is constructed by the wafer base 13, the movable stages 14A, 14B, the sample bases 15A, 15B, and the driving mechanisms therefor. That is, the wafer stage system of this embodiment resides in the double-wafer stage system. For example, the wafer W2 can be subjected to the exchange and the alignment on the side of the movable stage 14B as the second wafer stage during the scanning exposure for the wafer W1 on the side of the movable stage 14A as the first wafer stage. Therefore, it is possible to obtain a high throughput.

The two-dimensional positions, the yawing amounts, the pitching amounts, and the rolling amounts of the movable stages 14A, 14B are measured highly accurately by unillustrated laser interferometers. The focus position of the wafer during the exposure (position of the projection optical system PL in the optical axis direction) is measured by an unillustrated autofocus sensor. For example, the positions of the movable stages 14A, 14B and the angles of inclination of the sample bases 15A, 15B are controlled on the basis of obtained measured values.

The main body section of the laser interferometer on the side of the wafer is fixed to an interferometer support member 57 which is fixed to the bottom surface of the support plate 53. The main body section of the laser interferometer on the side of the reticle is fixed to an interferometer support member 58 which is fixed to the upper surface of support plate 53. The support plate 53 of this embodiment is suppressed for the influence of the external vibration by the aid of the variable mount sections 52A to 52C (as for 52C, see FIG. 5). Therefore, the position can be measured highly accurately by using the laser interferometer.

Figure 2:
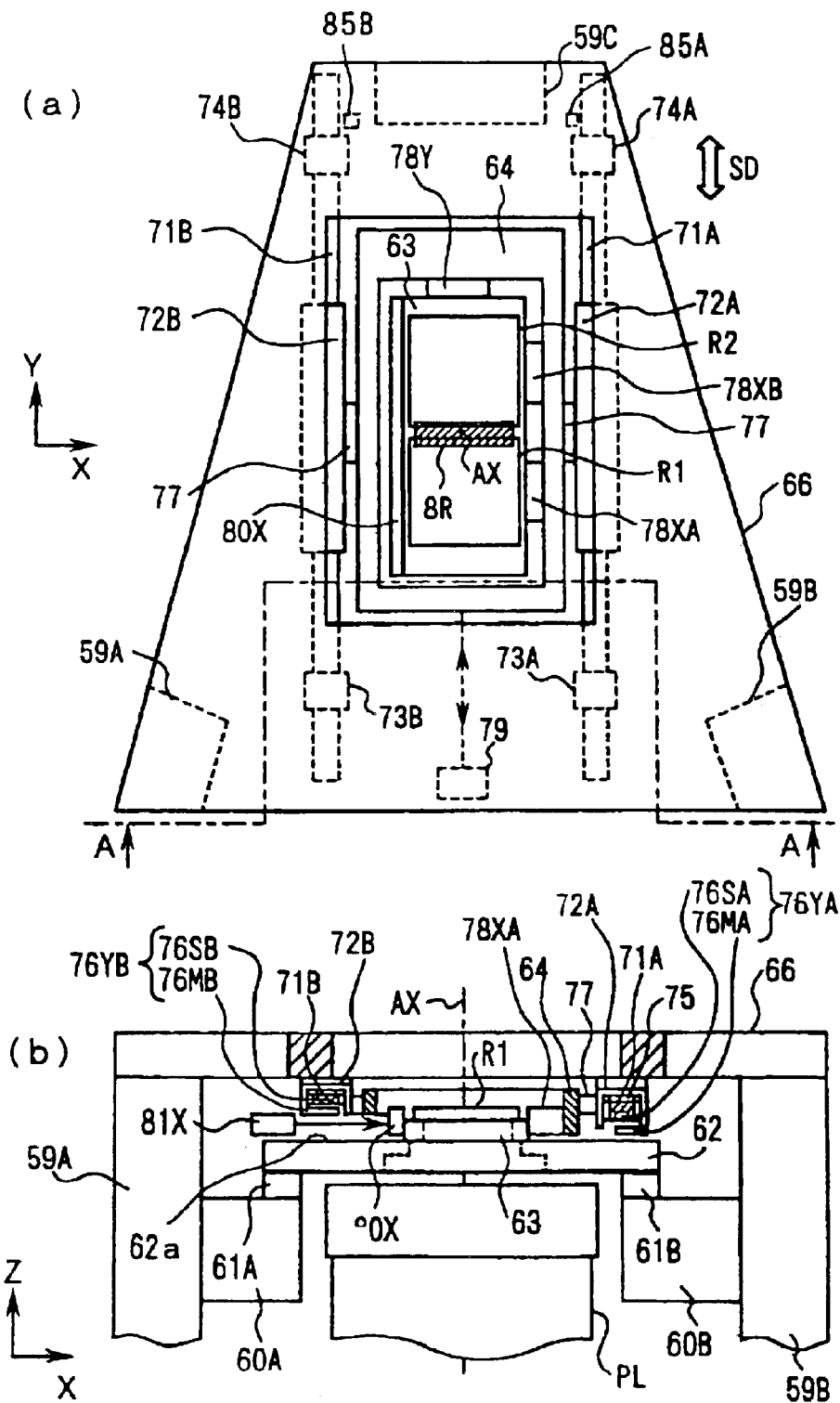
FIG. 2(a) shows a plan view illustrating a support plate 66 and a reticle stage system shown in FIG. 1.
FIG. 2(b) shows a sectional view taken along a line AA shown in FIG. 2(a).

Next, the arrangement of the reticle stage system of this embodiment will be explained in detail below with reference to FIGS. 2 to 4.

FIG. 2(a) shows a plan view illustrating the support plate 66 and the reticle stage system shown in FIG. 1, and FIG. 2(b) shows a sectional view taken along a line AA shown in FIG. 2(a). As shown in FIG. 2(a), the support plate 66 is stably supported by the three first columns 59A to 59C which are arranged approximately at the apexes of the regular triangle (actually having a shape approximate to an isosceles triangle which is slender in the scanning direction (Y direction)). A pair of slender rod-shaped Y axis guides 71A, 71B are arranged on the bottom surface side of the support plate 66 so that the opening provided for the support plate 66 for allowing the exposure light beam to pass therethrough is interposed in the non-scanning direction (X direction). Both ends of the first Y axis guide 71A are supported slidably in the Y direction substantially in a non-contact state by the aid of air bearings 82 (air pads, see FIG. 3) at the inside of two frame-shaped holding members 73A, 74A which are fixed to the bottom surface of the support plate 66 along the Y axis. Both ends of the second Y axis guide 71B are also supported slidably in the Y direction at the inside of holding members 73B, 74B which are fixed to the bottom surface of the support plate 66.

As shown in FIG. 2(b), sliders 72A, 72B are arranged slidably in the Y direction by the aid of air bearings (air pads) 75 along the Y axis guides 71A, 71B. The coarsely movable stage 64 is arranged between the sliders 72A, 72B by the aid of connecting members 77. Owing to this arrangement, the coarsely movable stage 64 is movable smoothly in the Y direction along the Y axis guides 71A, 71B together with the sliders 72A, 72B in a state of being hung on the bottom surface side of the support plate 66.

In order to drive the coarsely movable stage 64 in the Y direction, as shown in FIG. 2(b), a Y axis linear motor 76YA is constructed by a stator 76SA comprising, for example, a permanent magnet array provided on the side of the first Y axis guide 71A, and a rotator 76MA comprising a coil provided on the side of the slider 72A. A Y axis linear motor 76YB, which comprises a stator 76SB and a rotator 76MB, is also attached to the second Y axis guide 71B and the slider 72B. The sliders 72A, 72B and the coarsely movable stage 64 are driven in the Y direction along the Y axis guides 71A, 71B by means of the two axes of the Y axis linear motors 76YA, 76YB. During this process, as shown in FIG. 2(a), the Y axis guides 71A, 71B are also movable at the inside of the holding members 73A, 74A, 73B, 74B. Therefore, the coarsely movable stage 64 and the sliders 72A, 72B, and the Y axis guides 71A, 71B are moved in mutually opposite directions along the Y axis so that the law of conservation of momentum is substantially satisfied. Accordingly, other portions (for example, the projection optical system PL and the wafer stage system) are prevented from being exerted by the influence of the vibration generated in the reticle stage system during the scanning exposure.

Since the Y axis guides 71A, 71B are movable in the Y direction, it is feared that the position may be gradually deviated during the process in which the scanning exposure is continuously performed. In order to correct the deviation, as shown in FIG. 2(a), linear encoders 85A, 85B based on the non-contact system such as the magnetic system or the photoelectric system, which serve as position-measuring units for measuring the positions of the Y axis guides 71A, 71B in the Y direction, are arranged at the bottom surface of the support plate 66. Further, as shown in FIG. 3 corresponding to a front view of FIG. 2(a), a position-correcting linear motor 83YA, which is composed of a stator 83SA and a rotator 83MA, is installed between the first holding member 73A and the Y axis guide 71A. A position-correcting linear motor 83YB, which is composed of a stator 83SB and a rotator 83MB, is installed between the second holding member 73B and the Y axis guide 71B. When the positions of the Y axis guides 71A, 71B measured by the linear encoders 85A, 85B are gradually deviated, the positions of the Y axis guides 71A, 71B can be moved to approximately central portions in the movable ranges in the Y direction by using the position-correcting linear motors 83YA, 83YB.

With reference to FIG. 2(a), the rectangular flat plate-shaped finely movable stage 63, which is slender in the Y direction, is arranged at the inside of the rectangular frame-shaped coarsely movable stage 64. The two reticles R1, R2 are placed on the finely movable stage 63 in the scanning direction. Each of the reticles R1, R2 is held, for example, by means of vacuum attraction by the aid of an unillustrated reticle holder section. Therefore, the reticle stage system of this embodiment can be also referred to as "double-holder system". The reticle stage system based on the double-holder system can be regarded to be a kind of "double-reticle stage".

As shown in FIG. 2(b), the finely movable stage 63 is placed movably two-dimensionally by the aid of the air bearings on the guide surface 62a of the reticle base 62 openings for allowing the exposure light beam to pass therethrough are formed at bottom surface portions of the finely movable stage 63 corresponding to the reticles R1, R2. Further, as shown in FIG. 2(a), two X axis actuators 78XA, 78XB, which are displaceable in the X direction in accordance with the non-contact system by using the electromagnetic force based on, for example, the EI core system, the system based on the use of the Lorentz's force, or the small-sized linear motor system, are installed between the inner surface of the coarsely movable stage 64 in the +X direction and the side surface of the finely movable stage 63 in the +X direction. A Y axis actuator 78Y, which is displaceable in the Y direction in accordance with the non-contact system by using the electromagnetic force in the same manner as described above, is installed between the inner surface of the finely movable stage 64 in the +Y direction and the side surface of the finely movable stage 63 in the +Y direction. The actuator based on the EI core system is an actuator which is capable of making relative displacement at high rigidity by pushing/pulling a plate made of a magnetic member (I type core) by using electromagnets including coils wound around E-shaped cores disposed on both sides.

In this embodiment, the finely movable stage 63 is driven in the X direction, the Y direction, and the direction of rotation relatively with respect to the coarsely movable stage 64 by using the two X axis actuators 78XA, 78XB and the one Y axis actuator 78Y. The position of the coarsely movable stage 64 in the Y direction is measured by a first reticle Y axis interferometer 79 which is composed of a laser interferometer arranged on the bottom surface of the support plate 66. During this process, especially, the position of the coarsely movable stage 64 in the X direction is not necessarily measured, because it is fixed. Further, a slender movement mirror 80X is fixed to the side surface of the finely movable stage 63 in the X direction. A reticle X axis interferometer 81X, which is composed of a laser interferometer, is arranged so that it is opposed to the movement mirror 80X. A measuring beam is radiated from the reticle X axis interferometer 81X onto the movement mirror 80X. The position of the finely movable stage 63 in the X direction is measured by the reticle X axis interferometer 81X. The reticle interferometers 79, 81X measure the positions of the coarsely movable stage 64 and the finely movable stage 63, for example, on the basis of reference mirrors (not shown) fixed to the side surface of the projection optical system PL.

In this embodiment, the finely movable stage 63 is driven with the three degrees of freedom (the X direction, the Y direction, and the direction of rotation about the Z axis) with respect to the coarsely movable stage 64. However, the finely movable stage 63 may be driven with four or more degrees of freedom (six degrees of freedom at the maximum). For example, the finely movable stage 63 may be driven with respect to the coarsely movable stage 64 by adding, to the three degrees of freedom described above, at least one of the Z direction, the direction of rotation about the X axis, and the direction of rotation about the Y axis.

Figure 3:
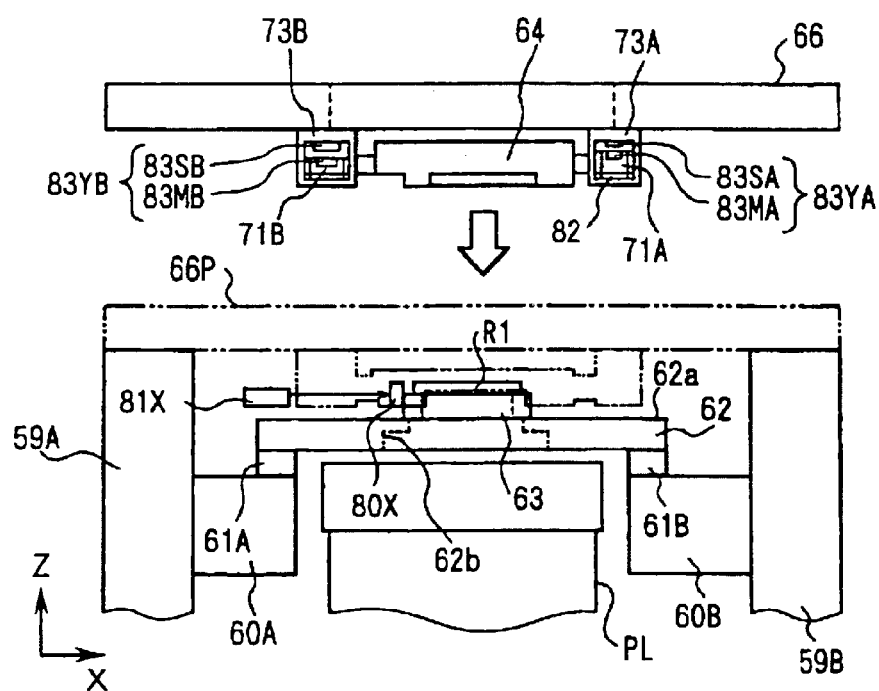
FIG. 3 shows a front view of major parts illustrating a state in which the support plate 66 is moved upwardly from columns 59A, 59B in the reticle stage system shown in FIG. 1.
Figure 4:
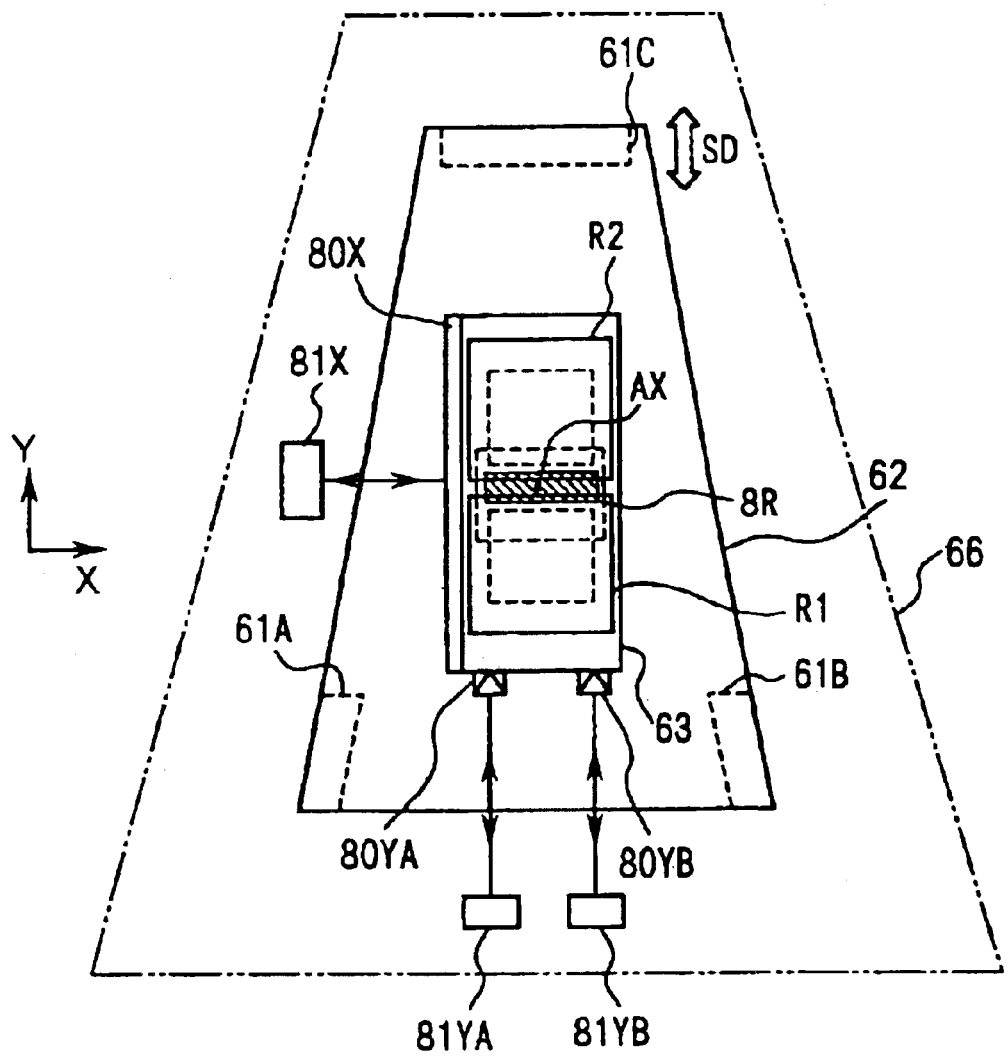
FIG. 4 shows a plan view illustrating a finely movable stage 63 and a reticle base 62 shown in FIG. 1.

FIG. 4 shows a plan view illustrating the finely movable stage 63 and the reticle base 62 shown in FIG. 1. As shown in FIG. 4, the reticle base 62 is stably supported by the three variable mount sections 61A to 61C which are arranged approximately at the apexes of the regular triangle (actually having a shape approximate to an isosceles triangle which is slender in the scanning direction SD (Y direction)). An opening 62b (see FIG. 3) for allowing the exposure light beam to pass therethrough is formed in an area of the reticle base 62 on the bottom surface side of the finely movable stage 63, i.e., an area under an illumination area 8R to be illuminated with the exposure light beam. Two corner cube-type movement mirrors 80YA, 80YB are fixed at a predetermined spacing distance in the X direction on the side surface of the finely movable stage 63 in the −Y direction. Measuring beams are radiated onto the movement mirrors 80YA, 80YB from second reticle Y axis interferometers 81YA, 81YB composed of external laser interferometers. The position in the Y direction and the angle of rotation (yawing amount) of the finely movable stage 63 are measured by the reticle Y axis interferometers 81YA, 81YB. For example, the reticle Y axis interferometers 81YA, 81YB also measure the position of the finely movable stage 63 on the basis of reference mirrors (not shown) fixed to the side surface of the projection optical system PL.

With reference to FIG. 4, the optical axis (measuring axis) of the reticle X axis interferometer 81X passes through the optical axis AX of the projection optical system PL disposed at the center of the illumination area 8R. The center line (symmetrical axis) of the optical axes of the two reticle Y axis interferometers 81YA, 81YB also passes through the optical axis AX. Accordingly, the projection exposure apparatus is constructed such that any measurement error (Abbe error) is not generated for the position in the X direction and the Y direction even when the finely movable stage 63 is rotated to some extent.

It is desirable that when the measuring beam and the pattern plane of the reticle R1, R2 are deviated in relation to the Z direction concerning at least one of the reticle Y axis interferometers 81YA, 81YB and the reticle X axis interferometer 81X, the at least one interferometer is constructed to radiate one more measuring beam separated from the measuring beam in the Z direction onto the movement mirror of the finely movable stage 63 so that the amount of inclination of the finely movable stage 63, i.e., at least one of the amount of rotation about the X axis (pitching amount) and the amount of rotation about the Y axis (rolling amount) is measurable on the basis of the measured values corresponding to the two measuring beams respectively. A position-detecting system (for example, an autofocus sensor on the reticle side) may be further provided to detect the position of the pattern plane of the reticle in the Z direction, if necessary.

Next, FIG. 3 shows a state in which the support plate 66, on which the coarsely movable stage 64 is hung, is deviated upwardly as starting from the state shown in FIG. 1. With reference to FIG. 3, when the reticle stage system of this embodiment is assembled, for example, then the reticle base 62 is firstly fixed on the variable mount sections 61A to 61C, and the finely movable stage 63 is placed on the reticle base 62. Concurrently therewith, the Y axis guides 71A, 71B, the coarsely movable stage 64, and other components are attached to the bottom surface side of the support plate 66 in the positional relationship as shown in FIG. 2. After that, the support plate 66 is fixed at a position 66P indicated by two-dot chain lines in FIG. 3 so that the finely movable stage 63 is included at the inside of the coarsely movable stage 64. Subsequently, the X axis actuators 78XA, 78XB and the Y axis actuator 78Y shown in FIG. 2 are attached. Thus, it is possible to efficiently assemble the reticle stage system.

Figure 6:
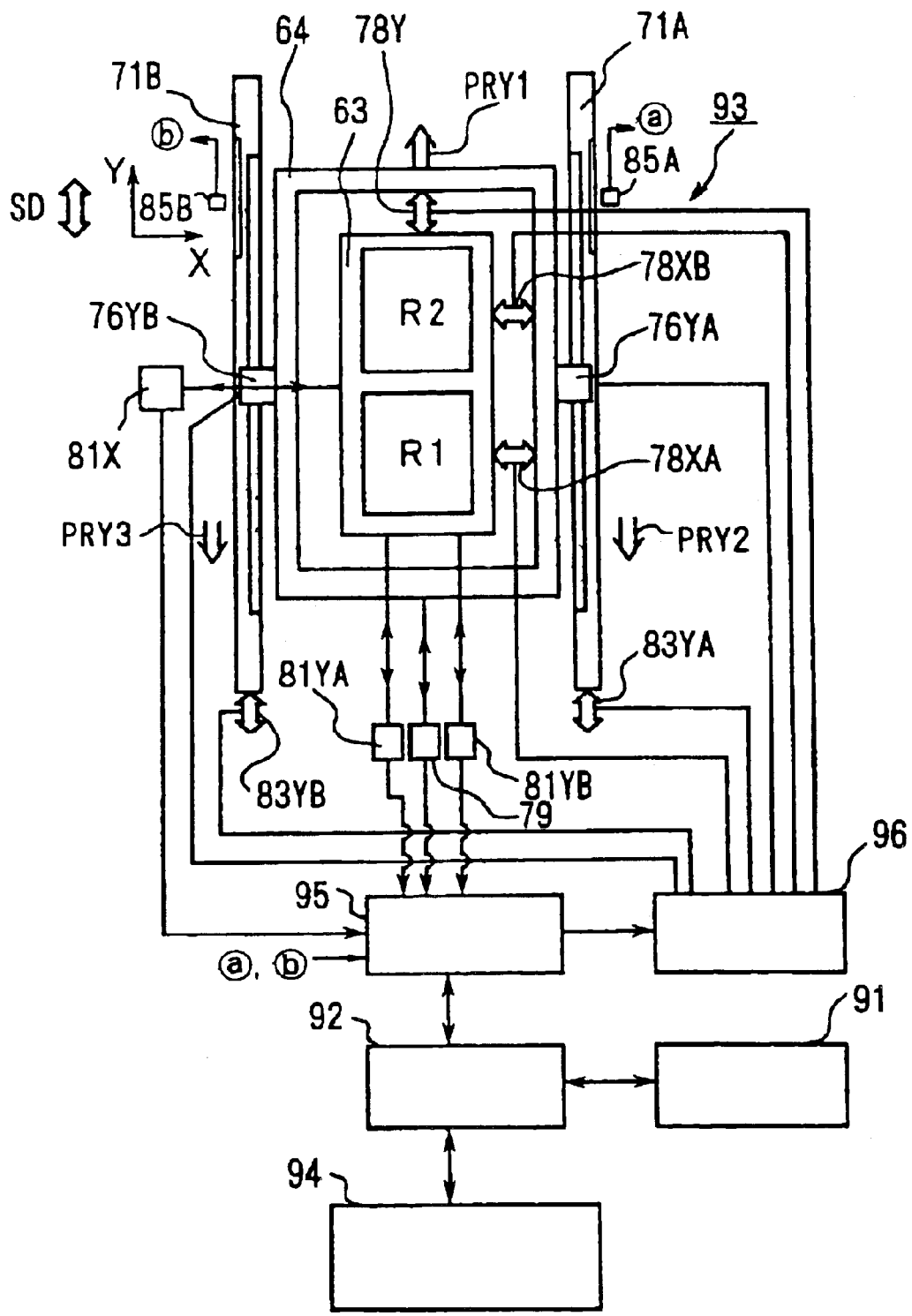
FIG. 6 shows a block diagram illustrating a control system for the reticle stage system according to the embodiment.

FIG. 6 shows a control system for the reticle stage system of this embodiment. With reference to FIG. 6, a synchronous control system 92 is connected to a main control system 91 which is composed of a computer for collectively controlling the operation of the entire apparatus. A reticle stage control system 93 for controlling the operation of the reticle stage system and a wafer stage control system 94 for controlling the operation of the wafer stage system are connected to the synchronous control system 92. The synchronous control system 92 supplies, for example, various pieces of timing information so that the operations of the reticle stage control system 93 and the wafer stage control system 94 are synchronized with each other during the scanning exposure under the control of the main control system 91.

In the reticle stage control system 93, the Y coordinate of the coarsely movable stage 64 measured by the first Y axis interferometer 79, the two Y coordinates of the finely movable stage 63 measured by the second reticle Y axis interferometers 81YA, 81YB, and the X coordinate of the finely movable stage 63 measured by the reticle X axis interferometer 81X are supplied to a position-detecting system 95. Further, the Y coordinates of the Y axis guides 71A, 71B measured by the linear encoders 85A, 85B are also supplied to the position-detecting system 95. The position-detecting system 95 supplies the measured values to the main control system 91 via the synchronous control system 92.

The respective operations of the Y axis linear motors 76YA, 76YB for driving the coarsely movable stage 64 in the Y direction, the X axis actuators 78XA, 78XB and the Y axis actuator 78Y for relatively driving the finely movable stage 63 with respect to the coarsely movable stage 64, and the position-correcting linear motors 83YA, 83YB for driving the Y axis guides 71A, 71B are controlled by a driving system 96. During the scanning exposure in which the finely movable stage 63 is scanned at the constant velocity in the scanning direction SD (Y direction), the main control system 91 supplies the information on the target position and the target velocity of the finely movable stage 63 to the position-detecting system 95 via the synchronous control system 92. Further, if necessary, the main control system 91 supplies, to the position-detecting system 95, the information on the corrected value of the relative position of the finely movable stage 63 with respect to the coarsely movable stage 64, and the target positions of the Y axis guides 71A, 71B in the Y direction.

Corresponding thereto, the position-detecting system 95 detects the errors of the position and the velocity of the finely movable stage 63, and for example, the positional discrepancy amount of the finely movable stage 63 from the center of the movable range with respect to the coarsely movable stage 64. The Y axis linear motors 76YA, 76YB and the actuators 78XA, 78XB, 78Y are driven by the aid of the driving system 96 so that the errors and the positional discrepancy amount are included in allowable ranges. Accordingly, the finely movable stage 63 and the reticles R1, R2 disposed thereon are scanned at the constant velocity in the +Y direction or the −Y direction. Further, the position is corrected so that synchronization error is corrected, if necessary. During this process, when the coarsely movable stage 64 and the finely movable stage 63 are moved in the Y direction with a momentum PRY1, the Y axis guides 71A, 71B are moved in the opposite direction with momentums PRY2, PRY3. Further, the following relationship holds in accordance with the law of conservation of momentum.

$$PRY1 = PRY2 + PRY3 \tag{1}$$

Usually, the adjoining shot areas on the wafer are successively subjected to the exposure, the reticle R1 (or R2) is alternately scanned in the +Y direction and the −Y direction by the finely movable stage 63. Therefore, the positions of the Y axis guides 71A, 71B are constant in average. However, for example, when the operation is migrated from the reticle R1 to the reticle R2, or when the reticle alignment is performed, it is feared that the Y axis guides 71A, 71B may be gradually moved in the Y direction, and they may be excluded from the movable range. In such a case, for example, the exposure can be continuously performed by correcting the positions of the Y axis guides 71A, 71B by using the position-correcting linear motors 83YA, 83YB by the aid of the driving system 96 before the start of the scanning exposure or during the period of migration to the exposure for the next shot area on the wafer (between the shots).

With reference to FIG. 2(a), for example, when the pattern of the first reticle R1 is transferred onto the wafer, the scanning is performed with the finely movable stage 63 in accordance with the reciprocating motion so that the illumination area 8R traverses across the reticle R1 alternately in the +Y direction and the −Y direction for every shot. When the pattern of the second reticle R2 is transferred onto the wafer, the scanning is performed with the finely movable stage 63 in accordance with the reciprocating motion so that the illumination area 8R traverses across the reticle R2 alternately in the +Y direction and the −Y direction for every shot. Accordingly, for example, even when the double exposure is performed with the patterns of the reticles R1, R2, then little period of time is required to make migration from the reticle R1 to the reticle R2, and the exposure is performed at a high throughput.

As described above, in the reticle stage system of the projection exposure apparatus of this embodiment, only the finely movable stage 63 is placed on the reticle base 62. All of the coarsely movable stage 64, the Y axis linear motors 76YA, 76YB, and other components for driving the finely movable stage 63 are hung on the support plate 66 disposed thereover. That is, the driving units for driving the finely movable stage 63 on the reticle base 62 make no contact with the reticle base 62 at all. Therefore, there is little influence, on the finely movable stage 63, of the vibration generated by the driving units such as the Y axis linear motors 76YA, 76YB. Thus, the high exposure accuracy is obtained. Even when the scanning velocity is increased, the influence of the vibration is not increased. Therefore, it is possible to enhance the exposure accuracy, and it is possible to increase the throughput.

No load of large weight is applied to the guide surface 62a of the finely movable stage 63. Therefore, the flatness of the guide surface 62a is maintained in a well-suited manner. Also in view of this fact, the high exposure accuracy is obtained. As described above, no load of large weight is applied to the reticle base 62 of this embodiment, and there is little influence of vibration as well. Therefore, for example, the reticle base 62 may be supported by the support plate 58 for the projection optical system PL shown in FIG. 1 by the aid of a support member (corresponding to, for example, the projections 60A, 60B shown in FIG. 1). In this arrangement, it is desirable that the variable mount sections 61A to 61C as described above are provided between the support member and the reticle base 62 or between the support member and the support plate 53. This arrangement also provides the following advantages. That is, no harmful influence of vibration or the like is exerted on the projection optical system PL. The spacing distance between the reticles R1, R2 and the projection optical system PL is maintained more stably. For example, it is unnecessary to provide the autofocus sensor on the reticle side for measuring the spacing distance between the reticles R1, R2 and the projection optical system PL in the Z direction.

The reticle stage system of this embodiment is based on the double-holder system. Alternatively, the double-stage system may be adopted based on the single-holder system in which only one reticle is placed on the finely movable stage 63, and two individuals of the finely movable stages are provided in parallel. Alternatively, the single-stage system may be adopted, in which only one finely movable stage based on the single-holder system is used. For example, with reference to FIG. 3, the air bearing (air pad) 82 is used as the buffering member when the Y axis guide 71A, 71B is held. A magnetically floating type bearing may be used for the buffering member. Further, for example, a mechanical bearing such as a ball bearing may be used for the buffering member, because the vibration of the Y axis guide 71A, 71B is not directly transmitted to the finely movable stage 63.

In the embodiment described above, the law of conservation of momentum is satisfied by using the Y axis guide 71A, 71B as the counter mass. Another arrangement is also available. That is, for example, the law of conservation of momentum may be satisfied by providing another counter mass separately from the Y axis guide 71A, 71B. Further, in place of the system in which the driving reaction force is offset by satisfying the law of conservation of momentum, for example, another column separate from the first columns 59A to 59C may be fixed on the base plate 12 or floor 1, an actuator to be provided on the another column may be used to apply the force for offsetting the reaction force generated during the movement of the finely movable stage 63 and the coarsely movable stage 64 to the coarsely movable stage 64 or the finely movable stage 63, the reticle base 62, or the support plate 66.

Next, a method for installing the projection optical system PL of the projection exposure apparatus of this embodiment will be explained in detail below.

Figure 5:
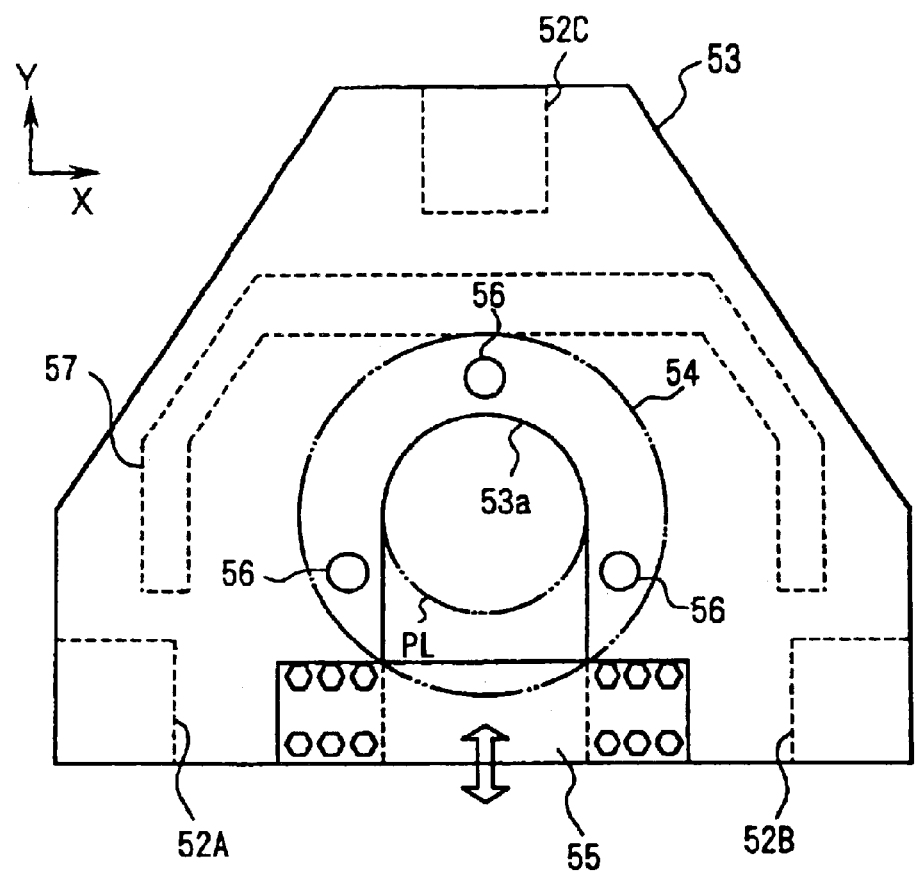
FIG. 5 shows a plan view illustrating a support plate 53 for supporting a projection optical system PL shown in FIG. 1.

FIG. 5 shows a plan view illustrating the support plate 53 on which the projection optical system PL shown in FIG. 1 is installed. With reference to FIG. 5, the support plate 53 is placed on the variable mount sections 52A to 52C which are arranged approximately at the apexes of the regular triangle. The U-shaped cutout 53a is formed on the side in the −Y direction of the support plate 53. The three driving elements 56 are arranged at intervals of equal angles around the cutout 53a. When the projection optical system PL of this embodiment is installed to the support plate 53, the following procedure may be adopted. That is, the projection optical system PL equipped with the flange 54 is inserted through the open end of the cutout 53a. After that, the flange 54 is placed on the driving elements 56. Subsequently, the cover 55 is screw-fastened so that the open end of the cutout 53a is covered therewith. Thus, the installation of the projection optical system PL is completed. For example, when the maintenance is required to be performed for the projection optical system PL during the operation of the projection exposure apparatus, then the cover 55 may be removed, and the projection optical system PL may be taken out from the cutout 53a.

As described above, in the projection exposure apparatus of this embodiment, the support plate 53 is placed on the variable mount sections 52A to 52C, and the driving mechanism for the finely movable stage 63 of the reticle stage system is arranged on the bottom surface side of the support plate 66 disposed thereover. There is no obstacle in the vicinity of the upper end of the projection optical system PL. Therefore, an advantage is obtained such that the projection optical system PL is easily attached and detached. When the projection optical system PL is of the normal cylinder type, the attachment and the detachment are performed more easily by adopting the arrangement as described above.

The projection exposure apparatus of the embodiment of the present invention can be produced by assembling the reticle stage system and the wafer stage system composed of a large number of mechanical parts, optically adjusting the projection optical system PL composed of the plurality of lenses, installing the projection optical system PL to the support plate 53, and performing the overall adjustment (for example, electric adjustment and confirmation of the operation). It is desirable that the projection exposure apparatus is produced in a clean room in which, for example, the temperature and the cleanness are managed.

Next, explanation will be made with reference to FIG. 7 for an example of the process for producing a semiconductor device based on the use of the projection exposure apparatus of this embodiment.

Figure 7:
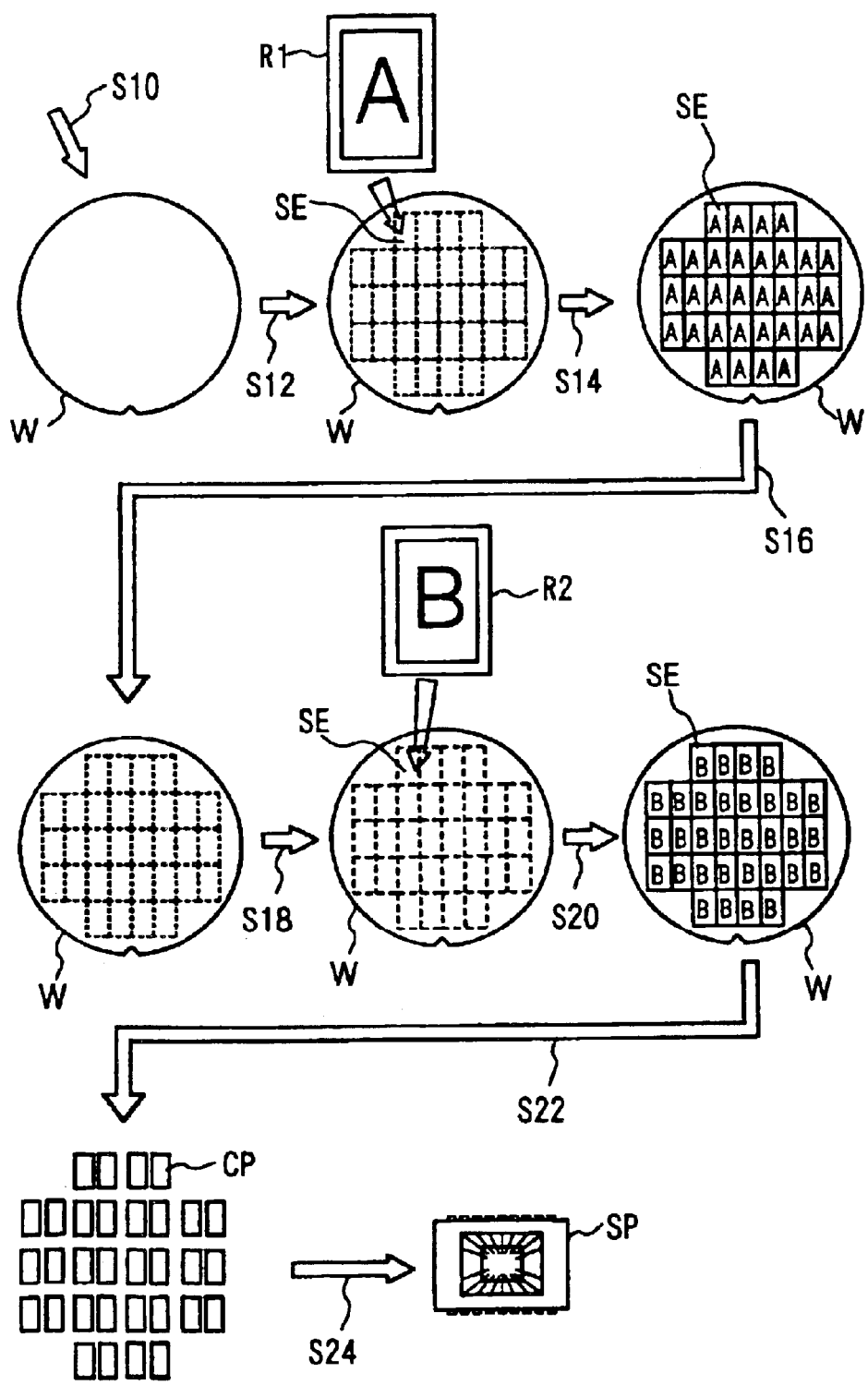
FIG. 7 shows exemplary steps of producing a semiconductor device according to the embodiment.

FIG. 7 shows exemplary steps for producing a semiconductor device. In FIG. 7, the wafer W is firstly produced, for example, from silicon semiconductor. After that, photoresist is applied onto the wafer W (step S10). In the next step S12, the reticle R1 shown in FIG. 2(a) is moved to the position under the illumination area so that all of the shot areas SE on the wafer W are subjected to scanning exposure with a pattern (indicated by the symbol A) on the reticle R1. Subsequently, in the step S14, a predetermined pattern is formed on the respective shot areas SE on the wafer W by performing, for example, the development, the etching, and the ion implantation.

Subsequently, in the step S16, the photoresist is applied onto the wafer W. In the step S18 to be performed thereafter, the reticle R2 in place of the reticle R1 shown in FIG. 2(a) is moved to the position under the illumination area so that the respective shot areas SE on the wafer W are subjected to scanning exposure with a pattern (designated by the symbol B) on the reticle R2. In the step S20, for example, the development, the etching, and the ion implantation are performed for the wafer W. Thus, a predetermined pattern is formed on the respective shot areas on the wafer W.

The steps ranging from the exposure step to the pattern formation step described above (step S16 to step S20) are repeated in a necessary number of times required to produce a desired semiconductor device. For example, the dicing step (step S22) for separating one by one the respective chips CP on the wafer W, the bonding step, and the packaging step (step S24) are performed. Thus, the semiconductor device SP as a product is produced.

In the embodiment described above, the present invention is applied to the projection exposure apparatus based on the scanning exposure system. However, the present invention is not limited thereto. The present invention is also applicable to the projection exposure apparatus of the full field exposure type such as those based on the step-and-repeat system. In such a case, the magnification of the projection optical system is not limited to the reduction system, which may be either the 1× magnification system or the magnification system. As for the projection optical system, when the far ultraviolet ray such as the excimer laser is used, it is desirable to use, as a saltpeter material, a material such as quartz and fluorite which transmits the far ultraviolet ray. When the $F_2$ laser or the like is used, it is desirable to use an optical system based on the cata-dioptric system or the reflecting system.

Further, the present invention is equivalently applicable even in the case of the exposure apparatus based on the proximity system, the exposure apparatus based on the use of the exposure light beam of the X-ray such as the hard X-ray and the EUV light beam in the soft X-ray region, and the exposure apparatus based on the use of the exposure light beam of the charged particle beam (energy beam) such as the electron beam and the ion beam. When the X-ray is used, for example, the reflecting system may be used for the projection system (especially in the case of the EUV light beam, the reflecting type projection system is used, and one of the reflecting type is also used for the reticle). When the electron beam is used, an electronic optical system composed of an electronic lens and a deflector may be used as the projection system (optical system). It is needless to say that the optical path, through which the electron beam passes, is in a vacuum state. Further, when the electron beam is used, it is possible to use, as an electron gun, lanthanum hexaboride ($LaB_6$) or tantalum (Ta) of the thermionic emission type.

The way of the use of the exposure apparatus is not limited to the exposure apparatus for producing the semiconductor. For example, the present invention is also widely applicable to the exposure apparatus for the liquid crystal element formed on the angular type glass plate and the display device such as the plasma display, and the exposure apparatus for producing the image pickup device (for example, CCD), the micromachine, the thin film magnetic head, and the DNA chip.

Further, when the linear motor is used for the wafer stage system and/or the reticle stage system, the movable stage may be held in accordance with any system including, for example, the air-floating type based on the use of the air bearing and the magnetically floating type. Further, the stage may be of the type in which the stage is moved along the guide, or of the guide-less type in which the guide is not provided.

As described in U.S. Pat. No. 5,528,118 corresponding to Japanese Patent Application Laid-Open No. 8-166475, the reaction force, which is generated by the movement of the wafer stage, may be mechanically released to the floor (ground) by using a frame member. Similarly, as described in U.S. Pat. No. 6,020,710 corresponding to Japanese Patent Application Laid-Open No. 8-330224, the reaction force, which is generated by the movement of the reticle stage, may be mechanically released to the floor (ground) by using a frame member. U.S. Pat. Nos. 5,528,118 and 6,020,710 are incorporated herein by reference. Further, in the embodiment described above, the base plate 12 is installed on the floor 1 by the aid of the vibration-preventive pedestals 11A to 11C, and the wafer base 13, the first columns 59A to 59C, and the second columns 51A, 51B are provided on the base plate 12. However, the present invention is not limited to this arrangement. That is, in place of the wafer base 13 installed on the base plate 12, for example, the wafer base 13 may be hung on the support plate 53 by the aid of the column, or the base plate 12 may be supported by the variable mounts 52A to 52C. In addition thereto or singly, in place of the vibration-preventive pedestals 11A to 11C, for example, the wafer base 13 and the second columns 51A, 51B may be supported by mutually different vibration-preventive pedestals respectively on the floor 1 or the base plate 12.

It is a matter of course that the present invention is not limited to the embodiments described above, which may be embodied in other various forms within a range not deviating from the gist or essential characteristics of the present invention. All of the contents of disclosure of Japanese Patent Application No. 11-358203 filed on Dec. 16, 1999 including the specification, claims, drawings, and abstract are quoted and entirely incorporated into this application.

According to the first exposure method and the exposure apparatus corresponding thereto, the coarsely movable stage (second movable member), which is provided to drive the movable stage (first movable member), is out of contact with the base member (reticle base) on which the movable stage is placed. Therefore, the movable stage can be controlled highly accurately at a high velocity without increasing the load on the base member. Further, the influence of the vibration from the driving unit for the coarsely movable stage is mitigated, and thus the high exposure accuracy is obtained.

According to the second exposure method and the exposure apparatus corresponding thereto, the first movable stage (reticle stage) and the second movable stage (wafer stage) are indirectly coupled to one another by the aid of the attitude control member for which the rigidity can be increased relatively highly. Therefore, the vibration having the low frequency is not transmitted to the two movable stages independently. Thus, the high exposure accuracy is obtained.

Therefore, the device having the high function, which is excellent, for example, in the pattern faithfulness such as the line width accuracy, can be mass-produced by performing the exposure for the pattern for the device by using each of the exposure apparatuses of the present invention.

What is claimed is:

1. An exposure apparatus for exposing a second object with an exposure light beam via a pattern of a first object, the exposure apparatus comprising:
   a base member;
   a movable stage which is arranged movably relative to the base member and on which the first object is placed; and
   a coarsely movable stage which is supported by being hung on a supporting member which is arranged over the base member without being in contact with the base member and which drives the movable stage in a predetermined direction.

2. The exposure apparatus according to claim 1, further comprising:
   a guide member which is supported on the supporting member; and
   a driving unit which drives the coarsely movable stage in the predetermined direction along the guide member.

3. The exposure apparatus according to claim 2, wherein:
   the first object and the second object are synchronously scanned in the predetermined direction when the second object is exposed; and
   the guide member is moved in an opposite direction to the predetermined direction so that law of conservation of momentum is substantially satisfied when the coarsely movable stage is driven in the predetermined direction by the aid of the driving unit.

4. The exposure apparatus according to claim 1, further comprising:
   a first measuring unit which measures a position of the coarsely movable stage in the predetermined direction;
   a second measuring unit which measures a two-dimensional position of the movable stage; and
   an actuator which finely moves the movable stage two-dimensionally with respect to the coarsely movable stage.

5. The exposure apparatus according to claim 1, wherein a plurality of masks to serve as the first object are placed in the predetermined direction on the movable stage.

6. A method for producing a device, comprising the step of performing exposure by using the exposure apparatus as defined in claim 1.

7. An exposure method for exposing a second object with an exposure light beam via a pattern of a first object, the exposure method comprising:
   providing a condition in which: a second base member is supported in a state capable of making displacement with a predetermined number of degrees of freedom on a first base member; a predetermined base member which is different from the second base member is supported on the first base member; a first movable stage for positioning the first object is placed movably on the second base member; a driving member for positioning the first movable stage is supported movably on the predetermined base member; and a second movable stage for positioning the second object is placed movably on the first base member; and
   controlling an attitude of the second base member with respect to the first base member so as to suppress vibration caused by movement of the first and second movable stages.

8. The exposure method according to claim 7, further comprising:
   supporting a third base member in a state capable of making displacement with a predetermined number of degrees of freedom on the first base member;
   placing, on the third base member, a projection system for projecting an image of the pattern of the first object onto the second object; and
   further controlling an attitude of the third base member with respect to the first base member so as to suppress the vibration caused by the movement of the first and second movable stages.

9. A method for producing a device, comprising the step of using the exposure method as defined in claim 7.

10. The exposure method according to claim 7, further comprising:
    moving a counter mass in an opposite direction to a moving direction of the second movable stage so that law of conservation of momentum is substantially satisfied with respect to the driving member so as to suppress the vibration caused by the movement of the driving member.

11. An exposure apparatus for exposing a second object with an exposure light beam via a pattern of a first object, the exposure apparatus comprising:
    a first base member which is supported by the aid of a plurality of vibration-preventive pedestals;
    a second base member which is placed on the first base member by the aid of a plurality of expandable/contractible or displaceable first attitude control members;
    a predetermined base member which is arranged on the first base member and which is different from the second base member;
    a first movable stage which is arranged movably on the second base member and which positions the first object;
    a second movable stage which is arranged movably on the first base member and which positions the second object; and
    a driving member which is arranged movably on the predetermined base member and which positions the first movable stage.

12. The exposure apparatus according to claim 11, further comprising:
    a projection system which projects an image of the pattern of the first object onto the second object; and a third base member which is placed on the first base member by the aid of a plurality of expandable/contractible or displaceable second attitude control members, wherein:

the projection system is supported on the third base member.

13. The exposure apparatus according to claim 12, wherein:

a cutout formed on the third base member; and the projection system is installed accessibly in a side surface direction with respect to the cutout.

14. The exposure apparatus according to claim 12, wherein the projection system is supported on the third base member by the aid of a plurality of expandable/contractible or displaceable third attitude control members.

15. A method for producing a device, comprising the step of performing exposure by using the exposure apparatus as defined in claim 11.

16. The exposure apparatus according to claim 11, further comprising:

a counter mass which moves in an opposite direction to a moving direction of the second movable stage so that law of conservation of momentum is substantially satisfied with respect to the driving member so as to suppress the vibration caused by the movement of the driving member.

17. A method for producing an exposure apparatus for exposing a second object with an exposure light beam passing through a pattern of a first object, the method comprising:

supporting a first base member by the aid of a plurality of vibration-preventive pedestals;

placing a second base member on the first base member by the aid of a plurality of expandable/contractible or displaceable first attitude control members;

arranging, on the first base member, a predetermined base member which is different from the second base member;

placing, on the second base member, a first movable stage which positions the first object so as to be movable;

placing, on the first base member, a second movable stage which positions the second object so as to be movable; and placing, on the predetermined base member, a driving member which positions the first movable stage so that the driving member is movable on the predetermined base member.

18. An exposure apparatus for exposing a second object with an exposure light beam via a pattern of a first object, the exposure apparatus, comprising:

a first base member which supports a first stage on which the first object is placed;

a second base member which is different from the first base member and which supports a driving member which drives the first stage in a predetermined direction; and a vibration-suppressing member which is arranged between the first base member and the second base member and which suppresses vibration of the first base member; and wherein the second base member is arranged over the first base member; and the driving member is supported by being hung on the second base member without being in contact with the first base member.

19. An exposure apparatus for exposing a second object with an exposure light beam via a pattern of a first object, the exposure apparatus, comprising:

a first base member;

a movable stage which is arranged movably relative to the first base member and on which the first object is placed;

a coarsely movable stage which is supported by being hung on a second base member which is arranged over the first base member without being in contact with the first base member and which drives the movable stage in a predetermined direction;

a vibration-suppressing member which is arranged between the first base member and the second base member and which suppresses vibration of the second base member with respect to the first base member; and a counter mass which is supported by the second base member and which moves in an opposite direction to a moving direction of the coarsely movable stage so that law of conservation of momentum is substantially satisfied with respect to the coarsely movable stage.

* * * * *